(12) United States Patent  
Schwirtlich et al.

(10) Patent No.: US 7,790,508 B2  
(45) Date of Patent: Sep. 7, 2010

(54) METHOD FOR FORMING A STRUCTURE

(75) Inventors: Ingo Schwirtlich, Miltenberg (DE); Hilmar Von Campe, Bad Homburg (DE)

(73) Assignee: Schott Solar AG, Mainz (DE)

( * ) Notice: Subject to any disclaimer, the term of this patent is extended or adjusted under 35 U.S.C. 154(b) by 1148 days.

(21) Appl. No.: 10/562,851

(22) PCT Filed: Mar. 8, 2005

(86) PCT No.: PCT/EP2005/002414

§ 371 (c)(1),
(2), (4) Date: Dec. 29, 2005

(87) PCT Pub. No.: WO2005/088730

PCT Pub. Date: Sep. 22, 2005

(65) Prior Publication Data

US 2008/0146016 A1   Jun. 19, 2008

(30) Foreign Application Priority Data

Mar. 9, 2004  (EP)  ................... 04005540

(51) Int. Cl.
*H01L 21/00* (2006.01)
(52) U.S. Cl. .......................... 438/119; 134/4; 252/500; 252/512
(58) Field of Classification Search .................. 438/119
See application file for complete search history.

(56) References Cited

U.S. PATENT DOCUMENTS

| 4,457,861 A |   | 7/1984 | Desmarais |         |
|-------------|---|--------|-----------|---------|
| 4,610,808 A | * | 9/1986 | Kleiner   | 252/512 |
| 5,653,918 A |   | 8/1997 | Towlson   |         |
| 5,722,602 A | * | 3/1998 | Kelley    | 241/17  |
| 6,071,437 A | * | 6/2000 | Oya       | 252/514 |
| 6,312,864 B1 |  | 11/2001 | Tokai et al. |       |
| 6,322,620 B1 |  | 11/2001 | Xiao      |         |
| 6,387,997 B1 | * | 5/2002 | Grolemund et al. | 524/506 |
| 6,406,646 B1 | * | 6/2002 | Lee et al. | 252/514 |

(Continued)

FOREIGN PATENT DOCUMENTS

JP          63 268773          11/1988

(Continued)

OTHER PUBLICATIONS

Lenkeit et al, High Quality Screen-Printed and Fired-Through Silicon Nitride etc., May 2000, Commission of the European Communities, pp. 1332-1335.

(Continued)

*Primary Examiner*—Charles D Garber  
*Assistant Examiner*—Pape Sene  
(74) *Attorney, Agent, or Firm*—Dennison, Schultz & MacDonald

(57) ABSTRACT

Method for constructing a line or dotted structure on a support, especially for constructing strip-like electrically conducting contacts on a semiconductor component such as a solar cell, by applying an electrically conducting paste-like substance containing a solvent adhering to a support and subsequent hardening of the substance. After the substance is applied to the support, a medium containing a polar molecule is applied on the support and/or the substance, through which the solvent contained in the substance is extracted.

28 Claims, 4 Drawing Sheets

U.S. PATENT DOCUMENTS

| | | | |
|---|---|---|---|
| 6,451,433 B1 * | 9/2002 | Oka et al. | 428/432 |
| 6,465,550 B1 * | 10/2002 | Kleyer et al. | 524/268 |
| 6,485,855 B1 * | 11/2002 | Fukuda et al. | 429/30 |
| 6,676,713 B1 * | 1/2004 | Okada et al. | 29/623.1 |
| 2001/0029977 A1 | 10/2001 | Oya | |
| 2002/0049274 A1 * | 4/2002 | Azechi et al. | 524/440 |
| 2003/0124259 A1 * | 7/2003 | Kodas et al. | 427/376.6 |

FOREIGN PATENT DOCUMENTS

| | | |
|---|---|---|
| WO | 93 24934 | 12/1993 |

OTHER PUBLICATIONS

Horzel et al, Screen-Printed Rapid Thermal Processed (RTP) Selective emitter Solar Cells etc., May 2000, Commission of the European Communities, pp. 1087-1090.

* cited by examiner

METHOD FOR FORMING A STRUCTURE

This application is a filing under 35 USC 371 of PCT/EP2005/002414, filed Mar. 8, 2005.

BACKGROUND OF THE INVENTION

The invention relates to a method for constructing a linear or punctiform structure on a support, especially for constructing strip-like electrically conducting contacts on a semi-conductor element such as a solar cell by applying an electrically conducting paste-like substance containing a solvent adhering to the support and subsequent hardening of the substance.

In manufacturing electronic structural elements the application of fine electrically conducting structures primarily takes place through physical or chemical gas phase precipitation, epitactic methods using masks or possibly with additional laser support. These techniques permit the manufacture of very fine structures, even if these are hardly suited for an economical mass production for economic reasons.

Other methods for applying fine structures are, for example, screen printing, roller printing or tampon printing. Even if these methods appear attractive from economic perspectives, there is nonetheless the disadvantage that only a restricted resolution of the structures is attainable, so that using it is suited only for larger electronic components with coarser structures.

In manufacturing solar cells, there exists with reference to the side facing the irradiation the requirement of applying as fine electrically conducting structures as possible, which assure good electrical conductivity as well as good electrical contact to the solar cell, thus to the support. This requirement is imposed against the background that the surface facing the irradiation is to be shaded as little as possible. Nonetheless, in order to make possible good electrical conductivity with a high tapping, the corresponding leads must have a large cross-section. In order to meet these demands, contacts are frequently applied according to the state of the art using screen printing. But a precondition for this is that the support has a level surface upon which linear or strip-like contacts are applied. Epitactic methods are also applied.

With a further known method, depressions are introduced into a solar cell surface using a laser beam, which are subsequently filled with a conductive material using chemical precipitation methods (U.S. Pat. No. 4,726,850). But an appropriate method is quite expensive and therefore cost-engendering.

An electrically conducting paste is applied to a support in WO-A-91/24934, whereby the paste is polymerized and stabilized with UV light.

In order to construct a structure on a plasma screen, applying a substance with a binding agent decomposing by heat, which is then hardened by the action of temperature, is known according to U.S. Pat. No. 6,312,864.

U.S. Pat. No. 6,322,620 proposes the hardening of a substance on a support through thermal treatment.

Printing methods for applying structures on a solar cell can be gathered from the literature: "Screen-printed Rapid Thermal Processed (RTP) Selective Emitter Solar Cells Using a Single Diffusion Step," 16$^{th}$ European Photovoltaic Solar Energy Conference, May 1-5, 2000, Glasgow, UK, p. 1087-1090 and "High Quality Screen-printed and Fired-through Silicon Nitride Rear Contacts for Bifacial Silicon Solar Cells," 16$^{th}$ European Photovoltaic Solar Energy Conference, May 1-5, 2000, Glasgow, UK, p. 1332-1335.

A paste is known from JP-A-63268773 which is solvent-free and contains a noble metal powder, fritted glass and metal oxide as well as binding agents.

Printing methods have the basic disadvantage that no high layer thickness can be generated with a small line width. This leads to the disadvantage that wider lines or a larger number of these are necessary to attain the desired low resistance values. Consequently an undesirable shading takes place.

Finger writing systems, to the extent that these succeed in being used in structuring solar cells, are basically suited for fulfilling the requirements. But the line width depends strongly upon the interaction between the substance to be applied, as a rule in the form of a paste, and the surface properties of the support. Paste and support basically influence the spreading out of the former after application. Moreover, the structures applied in the form of linear strips manifest the tendency to run. The structure applied becomes partly coarse by this. Fine openings of the finger writing systems can be selected in order to avoid these disadvantages, owing to which, nonetheless, the risk increases that the strips to be applied tear. The high sensitivity of the process to the relevant process parameters therefore leads to the corresponding technique being used but seldom.

SUMMARY OF THE INVENTION

The present invention is based upon the problem of developing further a method of the known type mentioned, such that the electrically conducting structures, such as printed conductors or contacts, can be applied on a support, especially a solar cell, whereby the shading in relation to the support should be minimized. At the same time, the resistance of the structure should be low. The method should also be suitable for mass production, especially in manufacturing electrically conducting contacts on a semi-conductor element such as solar cells.

To solve the problem, the invention basically provides that a medium containing a polar molecule is applied on the support and/or the substance after applying the substance, through which the solvent contained in the substance is extracted.

Moreover, the paste-like substance can be applied to the support, for example, using screen printing, tampon printing, spraying techniques or preferably using finger writing techniques.

In accordance with the invention, that fine printed conductors are manufacturable and hardenable is attained by the application of liquids with polar molecules (media) to the freshly applied paste structure, so that the freshly applied paste material or paste substance are prevented or restricted from flowing together, or a drawing together of the paste substance takes place. The pastes consist of mixtures of binders, solvents, detergents and metal particles and glass-like and/or ceramic bodies.

The polar solvent particles are extracted out of the paste through the attractive interaction of the medium on the edge and on the surface of the paste. The interaction between the polar molecules of a medium with a dipole element, such as, for example, media containing water, alcohol, acetone and other polar molecules with the polar solvent out of the paste is regarded as a generally valid approach. The solvent diffuses out of the paste in the edge region and leaves behind an edge zone poor in solvent. This corresponds to a hardening and in this way causes a stabilizing of the printed conductor structure by the edge layer.

It was possible to establish that the width-height ratio of the structures applied can be altered with the paste-like substance through interaction between the substance and the applied medium. With the medium, it is, in particular, a matter of a solution of polar molecules that can interact with the surface of the substance as well as with that of the support.

Moreover, it can be brought about that the paste-like substance is altered shortly after application to the substrate in its breadth-height ratio in cross-section in favor of greater height and lesser width by addition of a solution containing polar molecules as the medium, so that the desired fineness of the punctiform or linear structure sought is set. Through the interaction of the substances involved, a fine structure of electrically conductive paste-like substances in accordance with requirements can be applied, whereby methods which are to be gathered from the state of the art are used for the application, hence screen printing, tampon printing, spray techniques or in particular using finger writing systems. Consequently, a desired fine structure can be economically applied on a support such as a solar cell with high throughput.

On the basis of the fine structure attainable through the theory of the invention, hence narrow contact surfaces between paste-like substance and support, a region results on the support along the substance structure after sintering, which was contacted initially, hence before sintering with the substance, but is subsequently exposed again by quasi contraction of the substance. This previously covered and then exposed again region is optically recordable and characteristic for the theory of the invention.

The amount of medium applied is decisive for the effectiveness and durability of the effect. If too much medium is applied, it can occur that the medium (for example, water, alcohol) creeps under the applied paste, that is, a hardening also takes place from the underside by the running out of paste solvent. In this way, the adhesive effect of the printed conductor to the substrate is destroyed. The goal is to generate a hard shell for preserving form stability and an adhering core of the printed conductor for preserving the adhesion on the substrate. Since the separation of the solvent out of the paste also depends on the amount of medium on the contact surface, that is, on the surface of the paste, this can be diminished by a foam. The medium is therefore administered in a diminished extent on the substrate, in that, for example, a surfactant for frothing the medium is introduced.

The running of the paste-like substance is also attained in another manner by applying the medium containing the polar molecule to the substrate, whereby the forces of adhesion of the medium to the support are greater than the forces of adhesion between the substance to the support. In this way a running or flowing out of the paste-like substance is inhibited, and this can even be pushed back. A quasi contraction of the applied substance manifests itself with the consequence that a good height-width ratio arises.

Of course, care should be taken that the forces of adhesion between the medium and the support, on the one hand, and the substance and the support, on the other, are adjusted to each other such that an infiltration of the substance does not occur, since otherwise a detachment of the substance from the support could take place. Consequently, it must be assured that a sufficiently good adhesion of the substance to the support exists. Nonetheless, at the same time, a sufficiently rapid hardening of the surface of the substance should take place, whereby an adherent core region should remain.

In other words, it can be guaranteed by using the medium that a running of the paste-like substance is prevented after application to the support, but at the same time a sufficient adhesion to the support is guaranteed, whereby if need be a contracting of the substance without sacrificing contact should be made possible.

With the support, it is in particular a question of a metal, preferably a semi-conductor material such as single and/or multiple crystalline silicon, germanium, a thin layer of amorphous silicon or compound semi-conductors such as cadmium telluride or copper indium diselenide. These materials are used as basic material for the manufacture of solar cells. Moreover, it is a principal aspect of the invention to attain fine metallic structures on the side of solar cells facing the irradiation, with low shading and consequently greater efficiency in the transformation of light into electrical energy. Of course, the theory of the invention should not be hereby restricted. Rather, the method of the invention can also be used to generate fine electrically conductive structures on insulators such as glass or ceramic substances. The use of structures of this type to heat areal supports can be mentioned by way of example. Metallic materials provided with insulation layers on which electrical components can be connected up based upon the theory of the invention.

The paste-like substance basically consists of one or more resins, one or more solvents as well as metallic powders such as silver, aluminum or lead glass as a sintering aid as well as glass and/or glass ceramics as adhesion mediators to the support. The substance can as mentioned be applied using screen printing, finger writing devices, tampon printing, etc., to the surface of the support. If a good wetting of the support surface takes place, thus with good adhesion between the substance and the support, then a running off—also called bleeding—of the substance occurs according to the state of the art, so that there exists the tendency to widen the applied structure, such as lines or strips. This tendency to widen can be partially counteracted by setting a high substance viscosity according to the state of the art. Moreover, thixotropic pastes can be used, the viscosity of which is reduced upon applying a shearing force, but strongly influences in a force-free state.

In contrast, it is provided in accordance with the main aspect of the invention that the outflowing or bleeding is prevented or confined in that a further medium such as a liquid or one containing such is applied to the support surface. With the medium it is a matter of a liquid or a foam. An aerosol is likewise conceivable. In order, among other things, to increase the adhesion to the support, a surfactant is preferably admixed to the medium. If the adhesion of the medium to the support is greater than that of the paste-like substance to the support, the substance is pushed back and a running or bleeding is prevented.

In particular, a surfactant medium such as water is used which can contain a surfactant. The hardening process basically also functions with water without surfactant. Water ensures hardening. The surfactant ensures foam formation and therewith primarily the proper dosage of the amount of water. Therefore, finer structures can be applied with the aid of the foam.

As mentioned, a solvent with polar molecules such as water, alcohol, acetone is used as a medium, which likewise separates the polar solvent out of the paste.

An attractive interaction with the solvent of the paste is generated by a polar solvent, which leads to the solvent of the paste being extracted, that is, passes into the solvent of which the medium consists.

This may be explained in reference to the following example. The dipole moment of water is $6.07 \times 10^{30}$ Cm. The dipole moment of the paste solvent, for example of alcohols, is $3.5\text{-}5.8 \times 10^{30}$ cm. When the dipole moments of the two solvents agree, an exchange occurs as a consequence of the concentration gradient. To this extent, there is overwhelmingly an exchange of the two liquids, such that the alcohol in the water goes into solution. Through the exchange of the polar molecules, a diminution of the solvent proportion in the material occurs in the edge zone of the material, which leads to a contraction of the applied paste. This leads to the form stability of the applied printed conductor.

Either an exchange or a repulsive interaction (as in the case of benzene, hexane or carbon disulfide, carbon tetrachloride (insoluble in water, since dipole moment is 0) occurs at strongly different concentration gradients. Here the substance of the paste is even pressed together and a diminution of the printed conductor width occurs, if subsequently a better wetting of the substance by the medium exists. The surfactant in the medium does not take care of the froth formation. It diminishes the surface tension in relation to the substrate and brings about a better wetting of the substrate. The surfactant-containing medium wets the substrate better than the paste, and therewith presses the paste together.

In the simplest case, the surfactant medium is a soap solution of water and soap.

In order, nonetheless, to prevent an excessively strong rolling back of the paste-like substance, owing to which in the worst case a dissociation of the printed conductor into individual drops and therewith interruptions could arise, the paste-like substance can have components that react chemically with the medium in order to form a mechanically stable surface or skin. The skin stabilizes the shape of the paste-like substance and consequently diminishes drop formation. Nonetheless, unreacted material remains behind in the interior of the paste-like substance, owing to which the adhesion of the paste-like substance on the surface of the substrate is maintained.

A reaction up to the core of the substance can even take place with thinly applied structures such as printed conductors with diameters of, for example, 100 µm, so that a complete hardening is attained. This hardening leads to a stable shape inside a few seconds. Nonetheless, as mentioned, care must be taken that the adhesion between the substance and the support is maintained as otherwise a detachment would take place.

Furthermore, water-soluble (polar) and water-insoluble (non-polar) solvents can be contained in the substance. The water-insoluble solvents here assure that the paste properties are maintained by the solvent, without this being extracted by the medium. In this way, a selective hardening of the outer layer of the substance is possible. An infiltration of the substance by the medium can basically be prevented in this manner.

Independently of this, a drying or sintering takes place in the usual way following stabilization of the paste, that is, preventing outflowing, to burn the metal particles of the substance into the substrate.

Forces of adhesion, cohesion and flow of the substance are crucial for the height-width aspect ratio of the paste-like substance. Here forces of adhesion between the substance and the surface of the support play a basic role. The organic components of the substance such as resins as well as solvents are decisive for this.

BRIEF DESCRIPTION OF THE DRAWINGS

Further details, advantages and features of the invention become apparent not only from the claims, the features to be inferred from these, but also on the basis of the embodiments to be inferred in connection with the drawings as well as the associated explanations, wherein:

DESCRIPTION OF THE PREFERRED EMBODIMENTS

Figure 1:
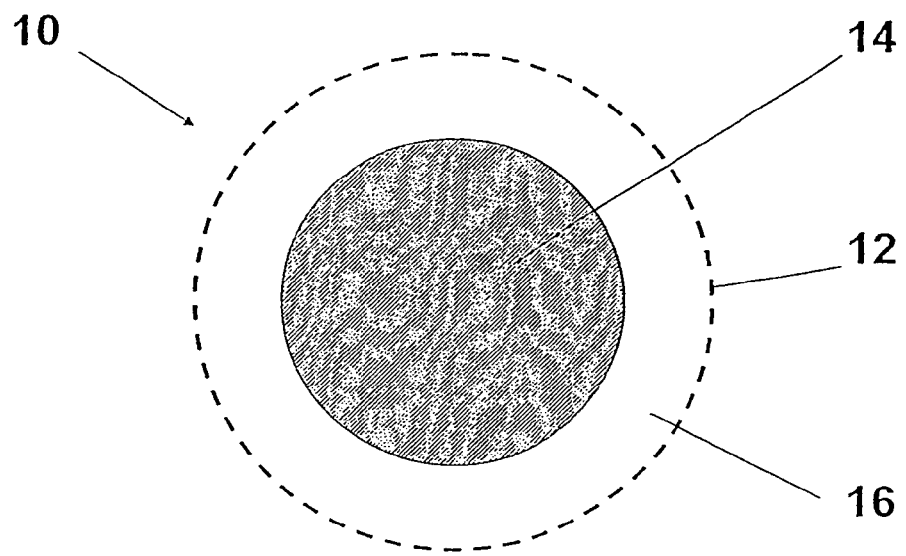
FIG. 1 depicts a cross-section through a linear structure, manufactured from a paste-like substance.

The theory of the invention is preferably used for improving the efficiency of solar cells on the basis of crystalline silicon substances, without, nonetheless, a restriction taking place hereby.

Silicon disks which are provided with a surface layer of $SiO_x$ with $x \leq 2$, or $Si_3N_x$ with $x \leq 4$, which serve to reduce the reflection to a radiation, are exposed to air or moist air. An activation of the substrate surface is to be determined in connection with a treatment of this type, which can be explained with the generation of electrically active centers on bonds of the silicon or the $Si_3N_x$. The corresponding treatment takes place preferably at a temperature T with approximately $30°$ C.$\leq$T$\leq$ca. $60°$ C. over a period of time t with preferably ca. 15 minutes$\leq$t$\leq$ca. 90 minutes. The relative humidity should lie between 40% and 90%. Alternatively, an activation of the surface of the support, thus the solar cell, can be reinforced by exposure toward an ozone-containing atmosphere or by additional treatment with UV light or by a corona discharge along the surface. An amplifying action can also be attained by subsequent or parallel treatment with a corona discharge.

A paste-like substance (hereinafter called paste for short) is applied to the surface of the support to be correspondingly treated, thus in the embodiment, of the solar cell. According to one aspect of the theory of the invention, the electrically conducting paste has short-chain substances which have a more strongly electronegative end. In this way, the paste is placed in a state which makes it possible to bring the surface charge of the paste, conditioned by the electronegative end after application upon the support, in interaction with the activated layer on the support. According to the setting of the paste, that is, the strength of the interaction, the latter inclines to diverge on the substance, or to a smaller contact surface. The divergence of the paste takes place on the basis of a small wetting angle between the paste and the support surface. Without additional measures, this would lead to an undesired wide metallic structure, which, of course, would have good adhesion properties in relation to the support surface. A running of the paste would then be prevented when ejecting forces arose between the paste and the support, owing to which a larger wetting angle would arise, which leads a capacity of the applied structures to detach due to the lack of adhesion.

In accordance with the invention, the running is prevented or contained, on the one hand, by the addition of a further medium or, on the other, a loosening of the paste from the support is prevented, so that narrow structures are attainable. The medium changes with the paste such that, on the one hand, a contraction of the applied paste structure takes place, on the other, the solidity in relation to the support is not disadvantageously influenced.

A liquid, preferably a foam, is used as a medium which is applied to the support immediately after application of the paste. Here the medium has a composition such that forces of adhesion between this and the support are greater than the forces of adhesion between the paste and the support. Conditioned in this way, the paste is quasi pushed back by the medium, with the consequence that a flowing apart is counteracted. Moreover, it could even be established that the structure is diminished in breadth due to forces of adhesion at work, thus the paste is narrowed in its breadth.

Moreover, the paste contains components which bring it about that, after applying the paste on the support, at least one surface hardening occurs, with the consequence that a spreading is prevented, since the paste applied, thus its shape, is retained by the surface hardening.

The paste can consist of several organic components such as resins and solvents, various binders and deflocculation agents in solid and/or liquid form as well as organic solids, such as, for example, a mixture of metals such as copper, silver, aluminum, lead, tin, soldering alloys as well as combinations from these and combinations of other, even non-metallic substances such as aerosols of silicon oxide, silicon nitride, zinc oxide, soot/graphite particles or powders containing these components as well as inorganic sintering aids. Furthermore, low temperature melting glass alloys or inorganic substances such as glass, lead-containing glass, boron or phosphorus silicate glass, or metal oxides can be added as sintering aids, melting point lowering agents, adhesion mediators during the sintering process, flux, etc., to the paste.

Furthermore, organic components such as polymers (resins) and organic solvents are added. In particular, the organic components of a paste can contain:
  binders such as acrylic and polyester resins, chloropenes, ethyl cellulose, ethylene, polyethylene, furanes, polyvinyl chloride, alkyd resins, epoxide resins, epoxide esters, polyurethanes, butadienes, silicones and mixtures thereof,
  solvents such as dimethyl ester, butyl ester, water, alcohols, ethanol, propanol, butanol, acetone, turpentine, benzene, benzine,
  cross-linking agents such as melamine, phenol resins, benzoguanamine, urea cross-linking,
  hardeners,
  layer formers such as polyvinyl butyral,
  wetting agents,
  rheological components,
  polymer modifiers such as plasticizers.

For example, the paste can consist of an ethyl cellulose binder dissolved in butyl diglycol, different binders of various chain lengths and additives, which are supposed to possess an influence on the ability of the paste to flow. A corresponding paste adjusted in suitable viscosity can be applied on the support such as the solar cell according to a suitable application method such as screen printing, model printing or finger writing methods.

If an application takes place according to finger writing technology, then the paste initially possesses a circular cross-section. The paste is drawn out longitudinally by the motion of the support relative to the outlet nozzle of the finger writing system. Moreover, the viscosity of the paste and the speed of the feed of the support should be set such that a paste thread with a diameter between 50 μm and 300 μm results, preferably 80 μm. Obviously, the finger writing system can also be moved in relation to the support, or these can be moved in relation to each other.

In order to prevent the otherwise occurring unwanted widening of the strip, measures proposed in accordance with the invention take place within the first seconds following application. Hence, the support or the paste strip can be brought immediately after its application on the support into contact with:
  a solid such as a fine power that binds the solvent to the paste surface and forms a closable skin,
  a liquid or a gas, either alone or in combination, which reacts with the solvent or the resin of the paste,
  electrical discharges which generate a plasma which leads to the surface hardening of the paste,
  electromagnetic radiation such as plastic-hardening UV light or IR irradiation with rapid drying effect to harden the surface.

In particular, the paste strip is brought into contact with a liquid containing water, such as foam, immediately after its application on the support. The foam extracts the organic solvent out of the paste material, and in this way brings about a mechanical change such as hardening the surface. The surface consequently forms a tough skin or crust, so that a further outflowing of the paste material is prevented. A firm crust is formed together with the solid content of the paste.

In the embodiment, the organic and at the same time water-soluble solvent butyl diglycol is removed up to 80% to 100% by contact with the media such as surfactant-containing water solution. This leads to a surface hardening such as crust formation.

If, for example, pegs of a breadth of 100 μm are applied, then a continuous hardening can occur. To prevent the completely hardened peg from being detached from the support, water insoluble solvents are also added in accordance with the invention in addition to the water-soluble solvents, owing to which, on the one hand, the desired hardening takes place and, on the other, the adhesion properties in relation to the support are retained.

In accordance with the invention, hardening and non-hardening resin-solvent mixtures with admixture of metal powders are consequently processed into pastes in connection with the surfactant medium, which harden in edge regions of a contact point in relation to the medium such as water-containing liquid or foam. The components of the pastes are mixed together such that a portion of the paste contains a water-soluble solvent, the other portion a water-insoluble solvent. After applying the paste mixture, the reaction with the medium such as foam leads to removal of the water-soluble solvent from subregions of the paste and therewith to hardening. The other portions of the paste remain unchanged, and, to be sure, those which contain water-insoluble solvents and consequently guarantee the adhesion properties toward the support.

According to a further proposal of the invention, a UV-hardening component can be added to the paste. Applying the paste to the support is conducted under the action of UV light, owing to which a hardening of the paste takes place on its surface. A soft core remains in the interior of the paste, which makes the original adhesion properties possible. The depth of penetration of the UV light lies in the range of 100 nm to 1 μm according to the absorption properties of the organic adhesion mixture, whereby a further penetration of the radiation is prevented by the metal particles in the paste.

After applying the punctiform, linear or strip-like paste and influencing it in accordance with the invention to avoid a flowing out or running, a drying and subsequent sintering takes place in the usual manner.

If one examined structures applied to a support in accordance with the invention, then it can be established that the coverage of the paste applied originally upon a support after the sintering process covers a smaller surface of the support than directly after the application of the latter. This is made clear on the basis of FIG. 1 to 3.

Hence a diagrammatic representation of a punctiform structure 10 applied to a support is reproduced in FIG. 1. The surface which the paste covers immediately after application to the support is symbolized by the outer circle 12. The paste is pushed back from the support by the medium applied immediately after application of the paste to the support, especially in the form of a surfactant-containing foam, so that the structure after sintering covers a surface 14 represented shaded in FIG. 1. A weak ring 16 enclosing the structure 14 is then recognizable on the support, which was originally covered by the paste material. A refinement of the punctiform structure takes place through the method of the invention.

Figure 2:
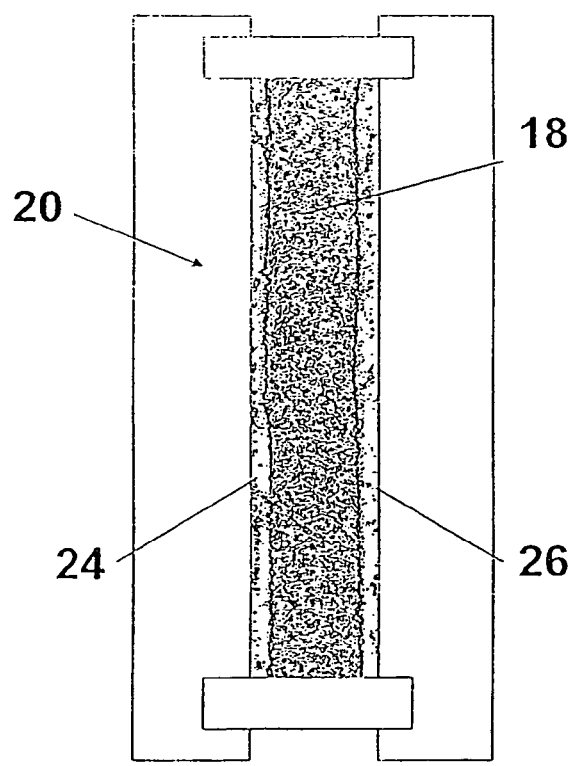
FIG. 2 depicts a top view of a support with a linear structure adhering to the latter.
Figure 3:
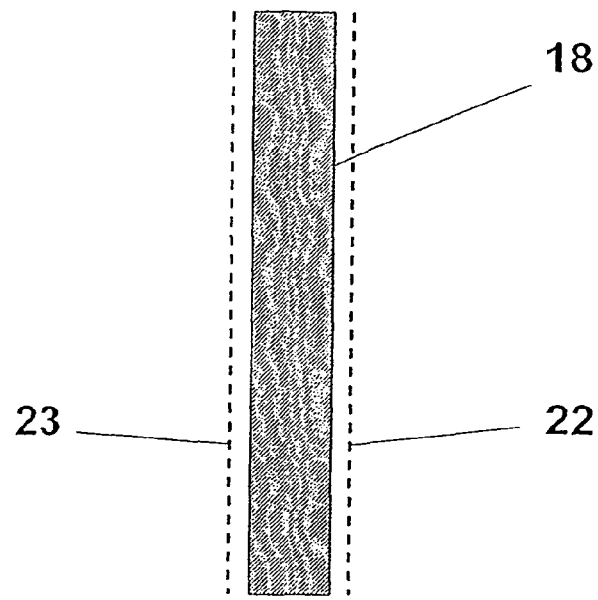
FIG. 3 depicts a diagrammatic representation of the linear structure applied to the support following application to the support or following sintering in accordance with FIG. 2.

The same holds in relation to a linearly applied structure 18, as FIGS. 2 and 3 make clear. FIG. 2 is a photograph of a paste-like strip applied on a solar cell 20, the width of which after sintering corresponds to the cross-hatched region 18 in accordance with FIG. 3. Originally the strip has a breadth which is clarified in FIG. 3 by the dotted line 22, 23 and in FIG. 2 by the strip 24, 26, in addition to the end structure 18.

Figure 5:
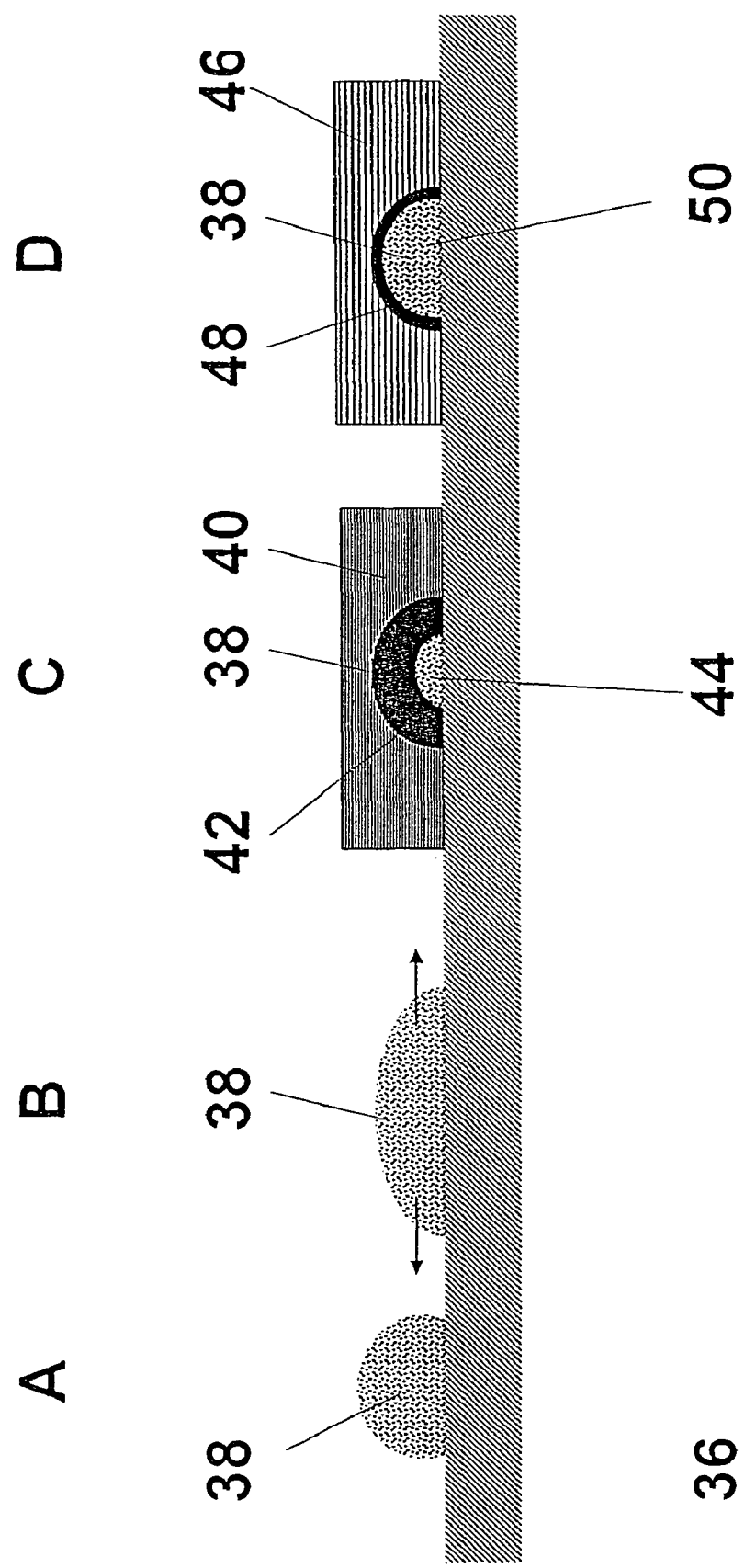
FIG. 5 depicts diagrammatic representations of printed conductors applied to a support.

FIG. 5 basically is supposed to make clear how a printed conductor 38 applied to a support 36 manifests the tendency to run, or how the latter is prevented or restricted on the basis of the theory of the invention. Hence the printed conductor 38 is represented in Representation A immediately after its application on support 36. Representation B, which represents the printed conductor after a time Δt after application, makes clear the tendency of the printed conductor to widen. Correspondingly, manufactured printed conductor manifest, therefore, a relatively large width extension with the consequence that the support 36 is considerably shaded. Now, it is provided in accordance with the invention that after a time Δt after the application of the printed conductor, whereby the time span can lie in the region between 0.1 s and 10 min., a medium containing a polar molecule is applied to the support 36 as well as the printed conductor 38. With the medium containing the polar molecules, it can be a matter of water, alcohol, acetone or mixtures of these, in order to mention media only by way of example. Since the paste substance of the printed conductor 38 contains solvent, this is at least partially extracted in to the medium, owing to which a solvent-free edge 42 arises in the paste, that is, in the printed conductor 38. The edge 42 is mechanically hard (stable). On the support 36, a narrow zone 44 with paste material which continues to adhere thus exists in the bottom region of the printed conductor 38, so that the contact to the support and the adhesion of the printed conductor 38 to the support 36 is assured.

In Representation D, the printed conductor 38 is likewise provided with a medium containing a polar molecule after a time Δt following application. That is, the medium 46 is applied to the support 36 and the printed conductor 38. It is a matter of a foam with the medium 46 in Example D. In particular, the medium for forming the foam contains a surfactant. A dosage of the amount of medium to be applied takes place conditioned by the foam, with the consequence that the amount of medium on the edge 48 of the printed conductor 38, thus the surface of the paste substance, is diminished, so that as a consequence of this, the interaction in the edge zone of the paste substance with the medium is diminished. Independent of this, however, an extraction of solvent from the substance this takes place, so that a narrow edge 48 becomes mechanically stable. At the same time, however, there results the advantage that a larger adhering paste core 50 remains, which assures a better adhesion on the support 36.

Figure 6:
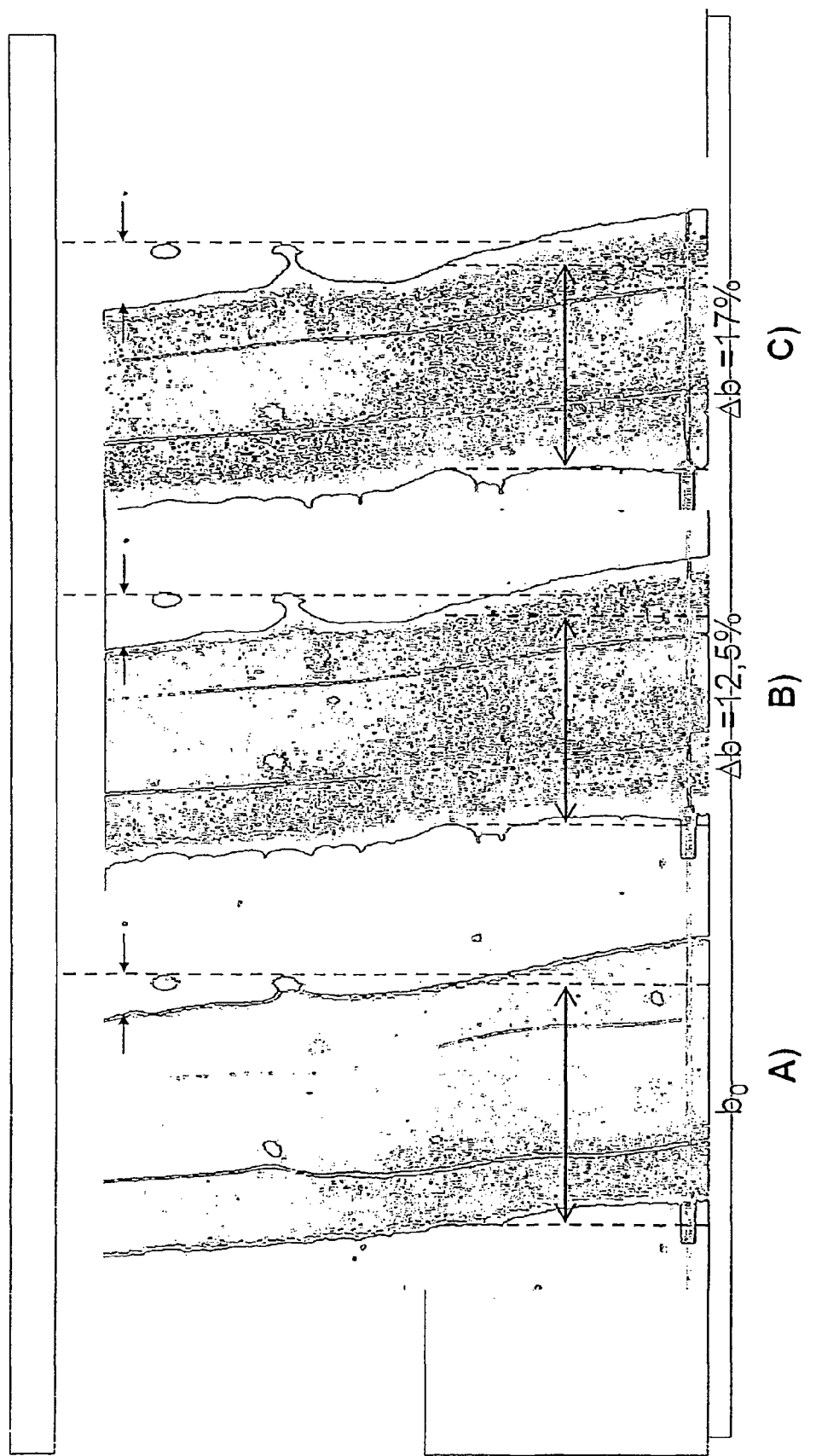
FIG. 6 depicts diagrammatic representations for clarification of the contraction of printed conductors on a support.

A further aspect of the invention is to be explained on the basis of FIG. 6, which rests not only upon the thought that solvent is extracted from the substance for hardening, but uses the interaction of medium, which contains polar molecules, and the support, on the one hand, and the substance and the support, on the other. Thus, a printed conductor is represented shortly after application to a support in FIG. 6A). Here the printed conductor has a width $b_0$. After 1 minute, the width has contracted by 12.5% in relation to the original width $b_0$, and after 3 minutes by 17% in relation to the width $b_0$. This contraction was brought about by the fact that a medium is used whose forces of adhesion in relation to the support are stronger than the adhesion of the substance to the support. In order to achieve this, a substance (paste) is used which contains, besides a polar solvent, a non-polar solvent which has a dipole moment equal to zero or a very small dipole moment. For example, two pastes can be mixed, one paste of which contains a non-polar solvent and the other of which contains a polar solvent. The diffusion out of the polar solvent does not lead to the complete hardening of the substance due to the presence of the non-polar solvent, that is, to incrusting of the edge of the printed conductor. The non-polar solvent diminishes the hardening effect on the edge and brings about a deformability of the printed conductor, as this is apparent from a comparison of FIGS. 6A), 6B) and 6C).

Furthermore, the proportions of the non-polar solvent in the substance also act against the infiltration of the substance, thus of the printed conductor by the medium, since the adhesion properties of the unhardened paste core remain preserved.

Figure 4:
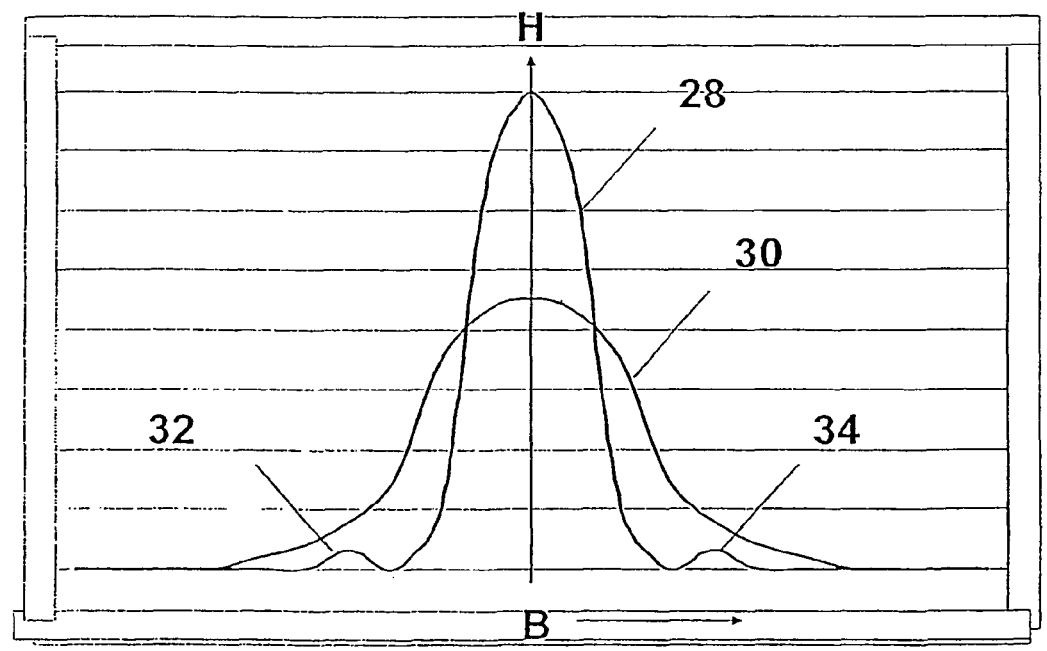
FIG. 4 depicts a graph for clarification of the height-width ratio of applied structures.

The differences between strip-like structures applied on a support according to the state of the art and the theory of the invention are likewise to be clarified on the basis of FIG. 4.

Hence, height and breadth of strip-like contacts applied to a silicon solar cell surface as a support are represented in FIG. 4, whereby the curve 28 symbolizes a contact which has been applied according to the theory of the invention and curve 30 according to such a state of the art. The units of height H and width B are selected differently in ordinates and abscissas.

The contact 28 applied with a finger writing method on the silicon solar cell has a breadth of ca. 50 μm to 200 μm, preferably 90 μm to 110 μm with a height H of 5 μm to 50 μm, preferably 30 μm. The side structures 32, 34 which can be determined following sintering on the solar cell surface, which correspond to the strips 24, 26 in FIG. 2, have a distance of ca. 150 μm with a height between 0.2 μm to 200 μm.

The aspect ratio between height and breadth reaches from 0.1 to ca. 1 and typically is 33 μm:110 μm=0.3.

The contact 30 conventionally applied in the screen printing method to a silicon solar cell in contrast has a breadth of ca. 50 μm to 300 μm, preferably 200 μm. The height of the peg runs between 5 μm to 25 μm. Consequently, there results an aspect ratio of height to breadth between 0.02 to 0.2 and typically lies at 14 μm:200 μm=0.07.

On the average, a refinement of the line breadth by 20 μm to 50 μm in relation to the original application breadth can be attained on the basis of the theory of the invention. The side structures, which are to be attributed to the contraction of the strip, are characteristic.

It should be stated by way of example, that, with an original breadth of ca. 130 μm, the final breadth, thus after sintering, comes to ca. 80 μm. In other words, by use of a surfactant-containing foam, this is so applied that an elimination of the solvent from the paste and a hardening of the surface takes place in such a manner and in a period of time that a reduction in width occurred in the previously indicated event.

The method of the invention can basically be used for various material pairings in which a structure is to be applied using metal-containing pastes on metallic substances and a line width of ≦150 μm is to be generated. This especially applies also for precipitated semiconductor layers on amorphous silicon, cadmium telluride compounds or copper indium diselenide compounds on glass supports which have been previously covered with a conductive layer.

The invention claimed is:

1. Method for constructing an electrically conducting linear and/or punctiform structure on a support, comprising the steps of:
    applying to a portion of the support a flowable, electrically conductive paste-like substance containing a solvent in a linear or punctiform arrangement;
    after said applying, contacting the substance with a medium containing a polar molecule, causing thereby the solvent contained in the substance to be extracted therefrom in an edge region, resulting in a hardening and stabilizing of the substance in the edge region.

2. Method according to claim 1, wherein the support comprises a semiconductor solar cell.

3. Method according to claim 1, wherein the polar medium comprises water or a mixture of water and at least one surfactant selected from the group consisting of anionic surfactants, cationic surfactants, non-ionic surfactants, and amphoteric surfactants.

4. Method according to claim 3, wherein the surfactants are selected from the group consisting of soap, fatty alcohol sulfates, alkyl benzene sulfonates, non-carbonic acid ester of polyalcohols.

5. Method according to claim 1, wherein the paste-like substance is applied to the support by at least one of screen printing, tampon printing, finger writing techniques or spraying techniques.

6. Method according to claim 1, wherein the polar medium is applied to the substance from about 0.1 to about 600 seconds after applying the substance to the support.

7. Method according to claim 6, wherein the polar medium is applied to the substance from about 1 to about 60 seconds after applying the substance to the support.

8. Method according to claim 1, wherein the substance is applied to the support in a circular cross section with a diameter d, where about 15 μm ≦d≦ about 300 μm.

9. Method according to claim 8, wherein d is about 80 μm.

10. Method according to claim 1, wherein the substance includes water soluble and water insoluble solvents.

11. Method according to claim 1, wherein the substance is applied to the substrate such that after hardening, the substance has a height to breadth ratio a, where 0.1≦a≦1.0.

12. Method according to claim 11, where a is about 0.3.

13. Method according to claim 1, wherein the support is a silicon substrate with a surface layer comprising at least one of silicon oxide and silicon nitride.

14. Method according to claim 1, wherein a concentration gradient between the polar medium and the substance is set with respect to the solvents present in the substance, such that the solvent of the substance is extracted into the medium.

15. Method for constructing an electrically conducting linear and/or punctiform structure on a support, comprising the steps of:
    applying to a portion of the support a flowable, electrically conductive paste-like substance containing a solvent in a linear or punctiform arrangement;
    after said applying, contacting the support with a medium containing a polar molecule, with forces of adhesion between the medium and the support being greater than forces of adhesion between the substance and the support,
    said contacting thereby substantially preventing flowing of the substance along the support and detachment of the substance from the support.

16. Method according to claim 15, wherein the polar medium is applied on the support in the form of a liquid or a foam in the region of the applied paste-like substance.

17. Method according to claim 16, wherein the polar medium comprises water or a mixture of water and at least one surfactant selected from the group consisting of anionic surfactants, cationic surfactants, non-ionic surfactants, and amphoteric surfactants.

18. Method according to claim 17, wherein the surfactants are selected from the group consisting of soap, fatty alcohol sulfates, alkyl benzene sulfonates, non-carbonic acid ester of polyalcohols.

19. Method according to claim 15, wherein the paste-like substance is applied to the support by at least one of screen printing, tampon printing, finger writing techniques or spraying techniques.

20. Method according to claim 15, wherein the polar medium is applied to the substance from about 0.1 to about 600 seconds after applying the substance to the support.

21. Method according to claim 20, wherein the polar medium is applied to the substance from about 1 to about 60 seconds after applying the substance to the support.

22. Method according to claim 15, wherein the substance is applied to the support in a circular cross section with a diameter d, where about 15 μm≦d≦ about 300 μm.

23. Method according to claim 22, wherein d is about 80 μm.

24. Method according to claim 15, wherein the substance includes water soluble and water insoluble solvents.

25. Method according to claim 15, wherein the substance is applied to the substrate such that after hardening, the substance has a height to breadth ratio a, where 0.1≦a≦1.0.

26. Method according to claim 25, where a is about 0.3.

27. Method according to claim 15, wherein the support comprises a semiconductor solar cell.

28. Method according to claim 15, wherein the support is a silicon substrate with a surface layer comprising at least one of silicon oxide and silicon nitride.

* * * * *